United States Patent
Faist et al.

(10) Patent No.: US 6,922,427 B2
(45) Date of Patent: Jul. 26, 2005

(54) QUANTUM CASCADE LASER

(75) Inventors: Jérôme Faist, Saint-Blaise (CH); Mattias Beck, Basel (CH); Antoine Muller, Neuchâtel (CH)

(73) Assignee: Alpes Lasers S.A., Neuchatel (CH)

( * ) Notice: Subject to any disclaimer, the term of this patent is extended or adjusted under 35 U.S.C. 154(b) by 329 days.

(21) Appl. No.: 10/363,093

(22) PCT Filed: Aug. 28, 2001

(86) PCT No.: PCT/CH01/00522

§ 371 (c)(1),
(2), (4) Date: Feb. 28, 2003

(87) PCT Pub. No.: WO02/19485

PCT Pub. Date: Mar. 7, 2002

(65) Prior Publication Data

US 2004/0013145 A1 Jan. 22, 2004

(30) Foreign Application Priority Data

Aug. 31, 2000 (EP) ............................................. 00810783

(51) Int. Cl.⁷ ................................................ H01S 5/00

(52) U.S. Cl. .............................. 372/45; 372/43; 372/44

(58) Field of Search ............................... 372/43, 44, 45

(56) References Cited

U.S. PATENT DOCUMENTS

| | | | |
|---|---|---|---|
| 5,457,709 A | | 10/1995 | Capasso et al. ............... 372/45 |
| 5,570,386 A | | 10/1996 | Capasso et al. ............... 372/46 |
| 6,137,817 A | * | 10/2000 | Baillargeon et al. .......... 372/45 |
| 6,751,244 B2 | * | 6/2004 | Faist et al. .................... 372/45 |
| 6,760,354 B2 | * | 7/2004 | Capasso et al. ............... 372/45 |
| 6,795,467 B2 | * | 9/2004 | Capasso et al. ............... 372/44 |
| 6,816,530 B2 | * | 11/2004 | Capasso et al. ............... 372/50 |

FOREIGN PATENT DOCUMENTS

| | | | |
|---|---|---|---|
| WO | WO 00/35060 | 6/2000 | ............. H01S/5/34 |
| WO | WO 00/59085 | 10/2000 | ............. H01S/5/34 |

OTHER PUBLICATIONS

Campman et al. "Interface roughness and alloy–disorder scattering contributions to intersubband transition linewidths" *Appl. Phys. Letters* 69:17:2554–2556; Oct. 21, 1996.

Faist et al. "Short wavelength ($\lambda \sim 3.4 \mu m$) quantum cascade laser based on strained compensated InGaAs/AlInAs" *Appl. Phys. Letters* 72: 6:680–682; Feb. 9, 1998.

Muller et al. "Electrically tunable, room temperature quantum–cascade lasers" *Appl. Phys. Letters* 75:11:1509–1511; Sep. 13, 1999.

(Continued)

*Primary Examiner*—MinSun Oh Harvey
*Assistant Examiner*—Cornelius H. Jackson

(57) ABSTRACT

Quantum cascade laser especially comprising a gain region (14) formed from several layers (20) which each comprise:
  alternating strata of a first type (26) each defining a quantum barrier made of AlInAs and strata of a second type (28) each defining a quantum well made of InGaAs, and
  injection barriers (22), interposed between two of the layers (20).

The layers of the gain region (14) each constitute an active region extending from one to the other of the injection barriers (22) which are adjacent to it. The strata (26, 28) are dimensioned such that:
  each of the wells comprises, in the presence of an electric field, at least a first upper subband, a second middle subband and a third lower subband and that
  the probability of an electron being present in the first subband is highest in the vicinity of one of the adjacent barriers, in the second subband in the middle part of the region and in the third subband in the vicinity of the other of the adjacent barriers.

20 Claims, 3 Drawing Sheets

OTHER PUBLICATIONS

Tredicucci et al. "High performance interminiband quantum cascade lasers with graded superlattices" *Appl. Phys. Letters* 73:15:2101–2103; Oct. 12, 1998.

Tredicucci et al. "Long wavelength superlattice quantum cascade lasers at λ=17 =μm" *Appl. Phys. Letters* 74: 5; Feb. 1, 1999.

Faist et al. "A quantum cascade laser based on an n–i–p–i superlattice" *IEEE Photonics Technology Letters* 12: 3: 263–265; Mar. 3, 2000.

Faist et al. "High–power continuous–wave quantum cascade lasers" *IEEE Journal of Quantum Electronics* 34: 2: 336–343; Feb. 2, 1998.

Faist et al. "Quantum Cascade Lasers" (Ch. 1) in *Semiconductors and semimetals* vol. 66; pp. 1–83; Academic Press; 2000.

* cited by examiner

QUANTUM CASCADE LASER

The present invention relates to quantum cascade lasers. More particularly, it relates to lasers comprising:
- a gain region formed:
  - from several layers each including alternating strata of a first type each defining a quantum barrier and strata of a second type each defining a quantum well, said strata consisting of a first and of a second semiconductor material, respectively constituting said barriers and said wells, and
  - from several injection barriers, each one being formed from a stratum of the first type and interposed between two of said layers,
- two optical confinement layers placed on each side of the gain region, and
- two electrodes, each one adjoining one of the confinement layers in order to apply an electric field thereto.

In the present document, the term "stratum" refers to a thin layer having a degree of uniformity in its composition, and the term "layer" refers to a set of strata providing one and the same function.

A laser of this type is described in U.S. Pat. No. 5,457,709. It consists of first and second type strata, which respectively form barriers and quantum wells. The materials constituting the barriers and wells are chosen so that they have a lattice parameter equal to that of the substrate, so as to preserve the single crystal structure throughout the thickness of the laser.

The difference in crystal potential of the first and second materials respectively constituting the first and second type strata defines, by quantum effect, one or more two-dimensional states called subbands.

Each of the layers comprises an active region and an energy relaxation region. The application of an electric field to the terminals of the electrodes generates a current of charge carriers especially inside the gain region.

The emission of laser radiation is generated by the transition of charge carriers in the active zone from a first to a second subband. In general, these charge carriers are electrons. This phenomenon, called intersubband transition, is accompanied by the emission of a photon.

More specifically, the wells of the active region comprise at least three subbands, respectively called the upper, middle and lower subbands. The emission of photons takes place during a transition between the upper and middle subbands. This transition is made possible because the population of the middle subband is low due to transfer of its electrons to the lower subband with emission of an optical phonon. For this to be so, it is necessary for the energy lost by a charge carrier passing from the middle subband to the lower subband to be larger than or equal to that of the optical phonons specific to the material used.

In the patent mentioned above, it is explained that the energy relaxation region is arranged so as to randomize the charge carriers and to dissipate their excess energy in order to allow efficient injection into the following layer. Thus, the population of the middle subband is low, hence there is a population inversion between the upper and middle subbands.

The injection barrier, which is thicker than the other barriers, is interposed between two adjacent layers of the gain region, in order to ensure that electrons pass from the lower subband of one layer to the upper subband of the other.

Another laser of this type is described in App. Phys. Letters, volume 73, number 15, of Oct. 12, 1998 and entitled "High performance interminiband quantum cascade lasers with graded superlattices" (A. Tredicucci et al.). This laser is called a miniband extraction type laser. In this case, although the excitation principle differs from that mentioned above, an active region, a relaxation region and an injection barrier are also found.

In fact, for a single crystal of this type to generate laser radiation, three functions must be provided:
- a population inversion of electrons between the two upper and middle subbands, in each of the layers, this function being provided by the active region,
- cooling (or relaxation) of the electrons, after transition, in each of the layers, this function being provided by the relaxation region, and
- injection of the electrons from one layer into the following one, this function being provided by the injection barrier.

By suitably adjusting the doping and the thickness of the strata, it is possible to make them fulfill the functions mentioned above. This savoir-faire is perfectly well known to a person skilled in the art. All information useful for this purpose can be found in the patent mentioned above.

It has been noted that, in known lasers, although the injection barrier is the thickest of the barriers of each layer, on the other hand it is in the active region that the thicknesses of the barriers are smallest, increasing from the injection barrier toward the relaxation region. Passage from the active region to the relaxation region is marked by a doubling of the thickness of the first barrier. In the embodiment described by Tredicucci et al., the thickness of the barriers of the relaxation region continues to increase up to the following injection barrier.

In optical phonon extraction lasers, as described in the patent mentioned above and in Appl. Phys. Letters, volume 75 number 11 of Sep. 13, 1999 in a publication entitled "Electrically tunable, room-temperature quantum-cascade lasers" (A. Müller et al.), only the barrier of the relaxation region adjacent to the active region is much thicker than the barriers of the active region.

The thicknesses of these strata are such that, in the active regions, electrons are present in the three subbands, while in the relaxation regions, the electrons are confined to the lower subband.

When the electrons have crossed toward the lower subband of a layer, they migrate, through the relaxation region and the injection barrier, toward the neighboring layer, the upper subband of which corresponds substantially to the potential of the lower subband from which the electrons come.

The variation in thickness of the barriers when passing from the active region to the relaxation region makes it possible to confine, in the active region, the electrons present in the upper layer.

In addition to the literature mentioned above, a complete study relating to quantum cascade lasers will be noted, presented in the work entitled "Semi-conductors and semi-metals" Vol. 66", in chapter 1 "Quantum Cascade Lasers", Academic Press, 2000.

The main aim of the present invention is to produce a laser based on a principle different from those mentioned above, and which has features which are comparable or even better than the known lasers. This aim is achieved by virtue of the fact that the layers of the gain region each constitute an active region extending from one to the other of the injection barriers which are adjacent to it and in which said strata are dimensioned such that:
- each of the wells comprises, in the presence of an electric field, at least a first upper subband, a second middle subband and a third lower subband, the probability of an electron being present:
in the first subband, is highest in the vicinity of one of the adjacent barriers,
in the second subband, is highest in the middle part of the active region, and
in the third subband, is highest in the vicinity of the other of the adjacent barriers, and
the transition of an electron from the upper subband to the middle subband forms the basis for the optical gain.

In fact, it is apparent that, unlike that which used to be assumed by a person skilled in the art, it is not necessary for the layers to have an active region, and a relaxation region.

This is because it has been shown, in practice, that it is quite possible for lasers formed from a succession of active regions and of injection barriers to be operated, without interposition of a relaxation region.

Advantageously, the thickness of the first type of strata of the active region increases monotonically from one to the other of the adjacent barriers.

Moreover, in such lasers, the first and second materials, respectively forming barriers and wells, are successively deposited, while ensuring that the latter are pure or suitably doped, each stratum having a uniform composition, except for the few atomic layers adjoining the neighboring strata. By proceeding in this way, a succession of wells and barriers having almost vertical sides is obtained. Now, it has been noted that electrons tend to diffuse at the interfaces of these strata.

More specifically, the study carried out by K. L. Campman et al., and published under the title "Interface roughness and alloy-disorder scattering contributions to intersubband transition linewidths" in Appl. Phys. Letters 69 (17), Oct. 21, 1996, has shown that the interfaces of the strata have a determining effect on the broadening of the intersubband transition, which generates an increase in the threshold current.

To alleviate this drawback, and in a particularly beneficial embodiment, the first type of strata and the second type of strata have concentrations of 100% of the first and of the second materials, respectively, in their middle part, while between two middle parts, the strata are formed from an alloy of said two materials, the concentration of which varies continuously.

In practice, it has been demonstrated that it is particularly beneficial for the laser to have an indium phosphide (InP) substrate, on which the various layers are placed.

Depending on the applications, the wavelength of the laser radiation must be relatively short. A study carried out by J. Faist et al., entitled "Short wavelength quantum cascade laser based on strained compensated InGaAs/AlInAs" and published in Appl. Phys. Letters vol. 72, No. 6 of Feb. 9, 1998, has shown that it is possible to increase the difference in crystal potential of the two materials forming the strata and, consequently, to reduce the wavelength of the photons emitted. It is for this reason, advantageously, that the first and second materials are chosen such that they have lattice parameters one of which is greater, the other of which is smaller than those of the substrate.

In some applications, it is necessary to have radiation with a narrow emission spectrum. For this purpose, the confinement layer opposite the substrate has a structure defining a diffraction grating having a pitch equal to a multiple of half the desired wavelength of its emission spectrum.

With an InP substrate, it is advantageous for the second material to be either InGaAs and the first to be chosen from AlGaAs, InP and AlInAs.

Other advantages and features of the invention will emerge from the following description, given with respect to the appended drawing, in which.

Figure 3:
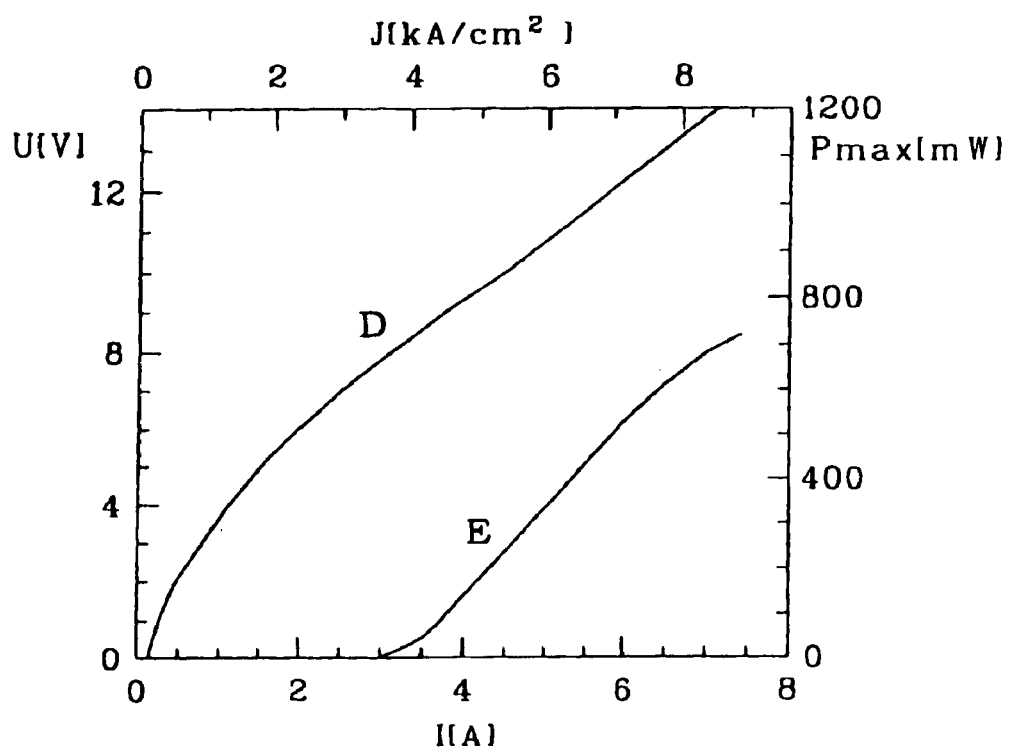
Figure 4:
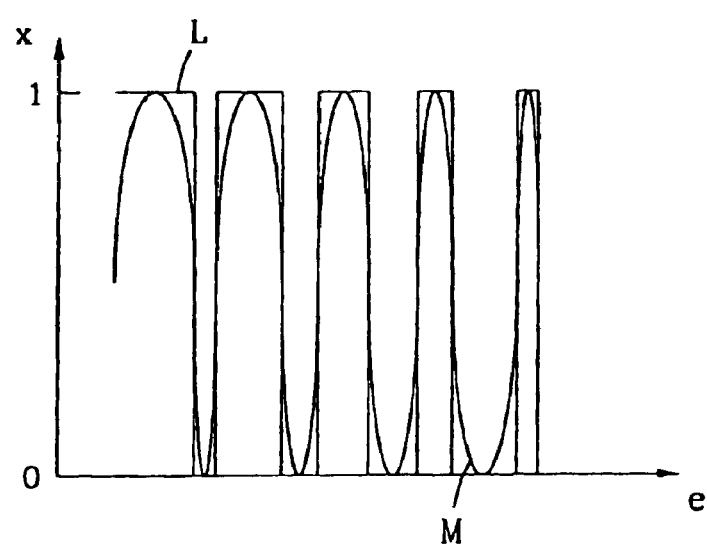

FIG. 3 gives, in the form of curves, physical properties obtained by means of a laser according to the invention, and FIG. 4 shows the variation in the chemical composition of the strata in a layer of the gain region.

Figure 1:
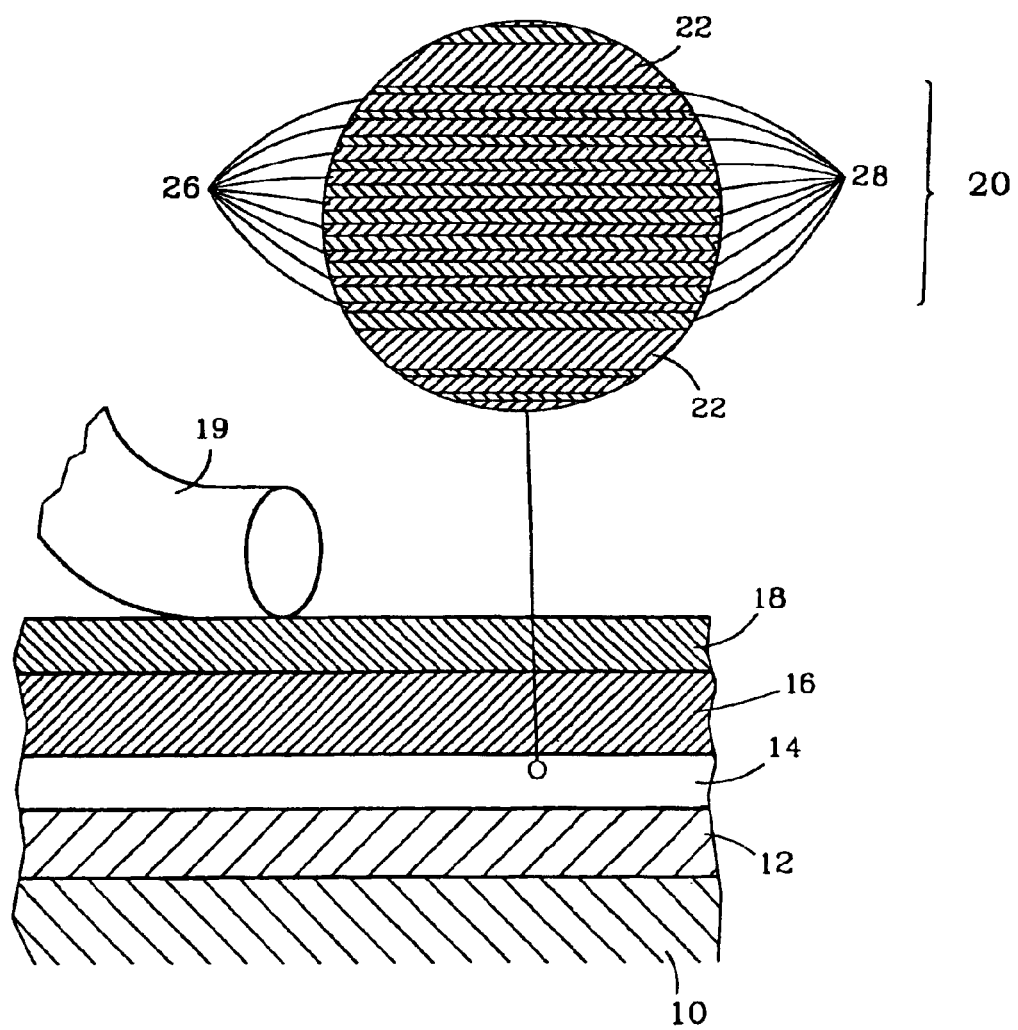
FIG. 1 shows, schematically and seen in section, a laser according to the invention.

FIG. 1 shows, schematically and by way of example, a section of a quantum cascade laser according to the invention, of unipolar type and in which the electrons are the charge carriers.

In this figure, the relative scales cannot be complied with, because of the particularly small thicknesses of some layers. The laser has a single crystal indium phosphide (InP) substrate 10, taking the place of an electrode. A first optical confinement layer 12, a gain region 14, formed by a stratified structure, a second optical confinement layer 16, and an electrode 18 are stacked on this substrate 10. The substrate 10 is fastened to a support not shown in the drawing. A wire 19 is fastened to the electrode 18. The laser is powered by applying a voltage between the support and the wire 19.

The optical confinement layers 12 and 16 are formed from an indium and gallium arsenide (InGaAs) alloy, with a ratio of 52% indium arsenide to 48% gallium arsenide. Such a composition allows a crystalline structure to be defined, having the same lattice parameter and identical to that of InP.

As can be seen in the enlarged part of FIG. 1, the gain region 14 consists of successive layers 20, and of injection barriers 22. The layers 20 are formed from strata 26 of a first type and from strata 28 of a second type, arranged alternately. The injection barriers 22 consist of a single stratum, while the layers 20 have at least three, and typically from five to twenty-five, strata 28 of the second type.

Each one of the strata 26, which forms a quantum barrier, mainly consists of an AlInAs alloy, with a ratio of 53 mol % indium arsenide to 47% aluminum arsenide. Such a composition generates a crystalline structure identical to that of InP.

Each one of the strata 28, which forms a quantum well, mainly consists of an InGaAs alloy having the same composition as the optical confinement layers 12 and 16.

A laser according to the invention has been produced according to the structure laid out in table 1 below.

TABLE 1

| Reference | Material | Dopant | Doping level [cm$^3$] | Thickness [nm] |
|---|---|---|---|---|
| Substrate 10 | InP | Si | $1 - 5 \times 10^{17}$ | very thick |
| Optical confinement layer 12 | Ga$_{0.5x}$Al$_{0.5(1-x)}$ InAs InGaAs Ga$_{0.5x}$Al$_{0.5(1-x)}$ InAs | | $2 \times 10^{17}$ $6 \times 10^{16}$ $3 \times 10^{17}$ | 25 200 12.4 |
| Gain region 14 | 35 times the structure of table 2 | | | 2128 |
| Optical confinement layer 16 | Ga$_{0.5x}$Al$_{0.5(1-x)}$ InAs InGaAs Ga$_{0.5x}$Al$_{0.5(1-x)}$ InAs | | $3 \times 10^{17}$ $6 \times 10^{16}$ $2 \times 10^{17}$ | 23 200 30 |
| Electrode 18 | InP InP InP | | $1 \times 10^{17}$ $7 \times 10^{18}$ $1 \times 10^{20}$ | 2500 850 10 |

Exemplary properties of the optical confinement layers 12 and 16 and of the electrode 18 are given completely in the patent applications filed under numbers PCT/CH 99/00572 and PCT/CH 00/00159 in the name of the applicant. It is for this reason that their structures will not be specified in a more detailed manner.

Table 2 gives the composition of strata forming an injection barrier 22 and a layer 20 of the gain region 14, of which there are thirty-five.

TABLE 2

| Reference | Material | Dopant | Doping level [cm³] | Thickness [nm] |
|---|---|---|---|---|
| Injection barrier 22 | AlInAs | | | 4.0 |
| Layer 20 | InGaAs | | | 2.0 |
| | AlInAs | | | 0.7 |
| | InGaAs | | | 6.0 |
| | AlInAs | | | 0.9 |
| | InGaAs | | | 5.9 |
| | AlInAs | | | 1.0 |
| | InGaAs | | | 5.2 |
| | AlInAs | | | 1.3 |
| | InGaAs | | | 3.8 |
| | AlInAs | | | 1.4 |
| | InGaAs | | | 3.5 |
| | AlInAs | | | 1.5 |
| | InGaAs | Si | $3 \times 10^{17}$ | 3.3 |
| | AlInAs | Si | $3 \times 10^{17}$ | 1.6 |
| | InGaAs | Si | $3 \times 10^{17}$ | 3.1 |
| | AlInAs | Si | $3 \times 10^{17}$ | 1.9 |
| | InGaAs | | | 3.1 |
| | AlInAs | | | 2.3 |
| | InGaAs | | | 3.0 |
| | AlInAs | | | 2.4 |
| | InGaAs | | | 2.9 |

The layer 20 is formed from six strata of the first type and 11 of the second type, while the barrier 22 consists of a single stratum of the first type.

The strata of the layers 20 are dimensioned so that each of the wells of the layer has at least an upper subband, a middle subband and a lower subband, the subbands of the same type being substantially at the same potential when the laser is powered. Conventionally, the transition of one electron from the upper subband to the middle subband forms the basis of the optical gain.

Figure 2:
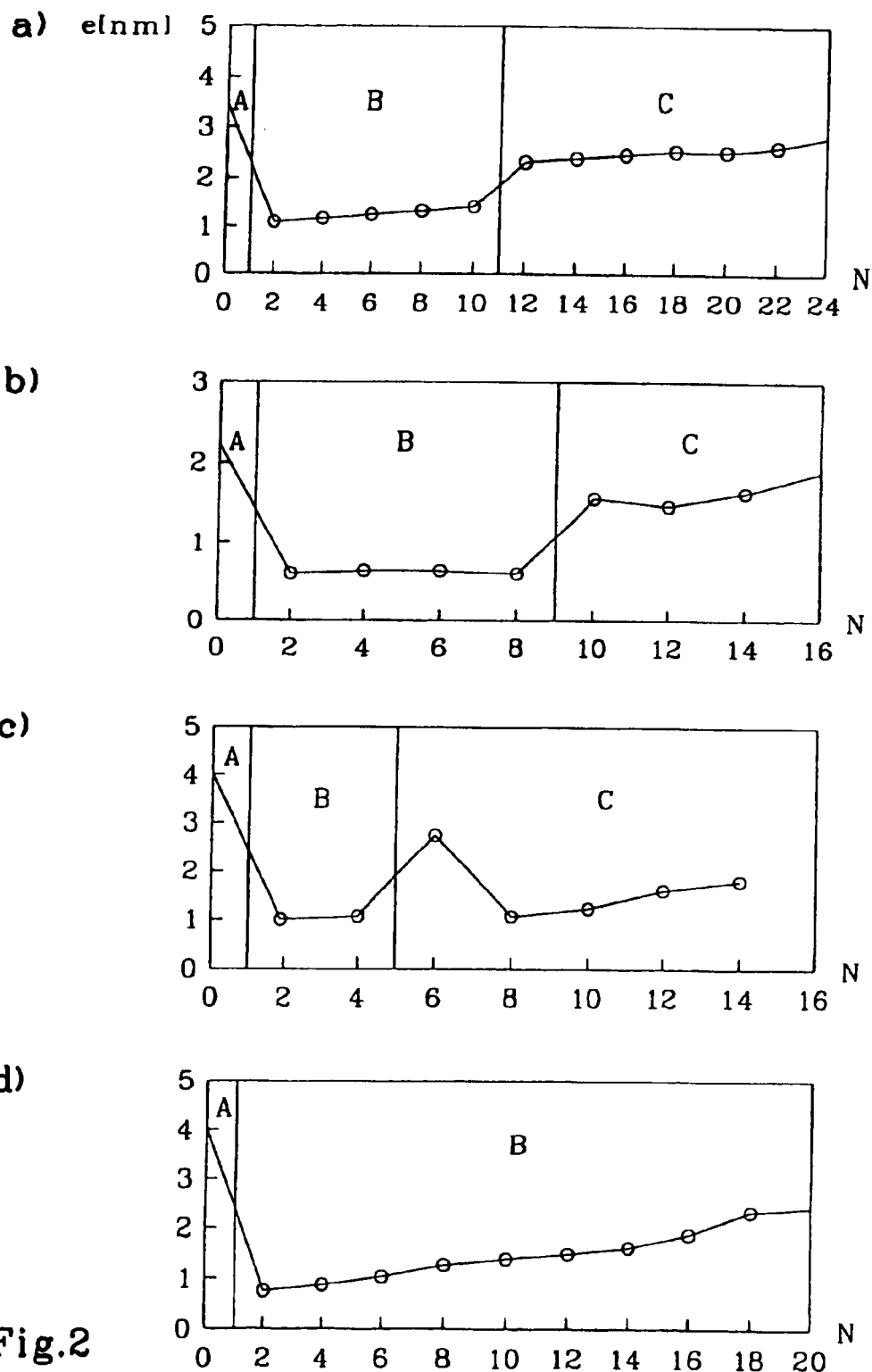
FIG. 2 represents curves showing the variation in thickness of the strata, in a, b and c for known types of lasers and in d for a laser according to the invention.

FIG. 2 makes it possible to see particularly clearly how the structure of the laser according to the invention differs from those hitherto applied to quantum cascade lasers. It comprises four diagrams, three a, b and c of which relate to known lasers, while diagram d corresponds to a laser according to the invention. The x-axis N indicates the stratum number of the layer 20 while the y-axis gives the thickness e of the stratum in question, expressed in nm. Only the thicknesses of the even strata, which relate to the barriers, have been indicated, the information relating to the wells not being significant. The zero stratum relates to the injection barrier 22.

More specifically, the diagrams a, b and c correspond respectively to lasers described in the following documents:

"High performance interminiband quantum cascade laser with graded superlattice", by A. Tredicucci et al. in Appl. Phys. Letters, volume 73 No. 15, of Oct. 12, 1998;

"Long wavelength superlattice quantum cascade lasers at λ=17 μm", by Tredicucci et al. in Appl. Phys. Letters, volume 74 No. 5, of Feb. 1, 1999 and "Electrically tunable, room-temperature quantum-cascade lasers" by A. Müller et al. in Appl. Phys. Letters, volume 75 number 11 of Sep. 13, 1999.

Three distinct parts can be seen in these three diagrams. The part A, which corresponds to the injection barrier, has a large thickness. The part B, in which the thicknesses are small and increase from the part A onward, relates to the active region. The part C relates to the relaxation region.

Diagram d in contrast shows only two distinct parts A and B, corresponding respectively to the injection barrier and to the active region.

More specifically, it is noted that, in the diagrams a and b, the strata forming the barriers of the relaxation region have a thickness substantially equal to twice those of the strata of the active region while, in diagram c, only one stratum of the relaxation region, located at the interface with the active region, is substantially thicker. This variation in thickness between active region and relaxation region makes it possible to confine the electrons in the active zone, which hitherto would have been considered by a person skilled in the art as indispensable.

In contrast, diagram d shows the thickness of the strata of the first type monotonically increasing from one injection barrier to the next.

Tests carried out show that it is possible to operate a laser without it having a relaxation region. The diagram of FIG. 3 shows the properties obtained with a prototype made according to the structure specified above. The curve D shows the relationship between the voltage U, expressed in volts, and the current density J, expressed in kA/cm². The curve E relates to the relationship between the maximum power $P_{max}$, expressed in mW, and the current I, expressed in amperes.

Table 3 below allows these results to be compared with those obtained by the laser of diagram 2a, at 30° C., that is under operating conditions at ambient temperature.

TABLE 3

| Properties at 30° C. | Invention | Prior art |
|---|---|---|
| Maximum power | 700 mW (I = 7A) | 500 mW (I = 11A) |
| Threshold current | 3.2 A | 4.5 A |
| Threshold current density | 4.0 kA/cm² | 5.2 kA/cm² |
| Efficiency | 250 mW/A | 120 mW/A |

The results obtained at other temperatures are readily comparable. Thus it clearly appears that the laser according to the invention is of course able to compete with known lasers, their performance even being superior.

The laser according to the invention can be improved by altering the chemical composition of the strata in the gain region, as shown in FIG. 4. In this figure, it is assumed that the chemical composition corresponds to the formula $Ga_xAl_{(1-x)}InAs$, in which x varies from 0 to 1, depending on the position considered within the thickness of the layer. The x-axis relates to the thickness e of the structure and the y-axis to x. The curve L shows the variation in composition as exhibited in the lasers according to the prior art and in the example given above, while the curve M relates to a particular embodiment.

To produce a structure having a composition corresponding to the curve L, the materials (InGaAs and AlInAs) are deposited in succession. By proceeding in this way, the wells and the barriers form almost vertical sides, the diffusion between strata being small. It has been noted that at the interfaces of these strata, the electrons tend to diffuse, as explained by K. L. Campman et al, in their article mentioned above.

A composition of the layer corresponding to the curve M makes it possible to alleviate this drawback. This curve has a shape with maxima in the middle parts of the strata, the composition varying continuously between two middle parts.

It is especially possible to produce a layer like the one shown by the curve M with the InGaAs and AlInAs depositions alternating more frequently, the thickness of each deposition representing a portion of a stratum, corresponding to a few atomic layers.

In some applications, it is necessary to have available a narrow light emission spectrum. This condition can be satisfied with an upper confinement layer, that is to say placed on the side opposite the substrate, which has a structure defining a diffraction grating having a pitch equal to a multiple of the desired wavelength of its emission spectrum. The production of such a grating is described in the patent application filed under number PCT/CH 00/0159, under the title "Laser semi-conducteur infrarouge" [Infrared semiconductor laser], in the name of the applicant.

The quantum cascade laser according to the invention may be subject to many variants, without however departing from the scope of the invention. Materials other than AlInAs, for example InP or AlGaAs, may form the barriers. The number of strata and their thicknesses may also vary considerably.

What is claimed is:

1. A quantum cascade laser comprising:
   a gain region (14) formed:
      from several layers (20) each including alternating strata of a first type (26) each defining a quantum barrier and strata of a second type (28) each defining a quantum well, said strata consisting of a first and of a second semiconductor material, respectively constituting said barriers and said wells, and
      from several injection barriers (22), each one being formed from a stratum of the first type and interposed between two of said layers (20),
   two optical confinement layers (12, 16) placed on each side of the gain region (14), and
   two electrodes (10), each one adjoining one of the confinement layers (12, 16) in order to apply an electric field thereto,
characterized in that the layers (20) of the gain region (14) each constitute an active region extending from one to the other of the injection barriers (22) which are adjacent to it and in which said strata (26, 28) are dimensioned such that:
   each of the wells (28) comprises, in the presence of an electric field, at least a first upper subband, a second middle subband and a third lower subband,
   the probability of an electron being present:
      in the first subband, is highest in the vicinity of one of the adjacent barriers,
      in the second subband, is highest in the middle part of the active region, and
      in the third subband, is highest in the vicinity of the other of the adjacent barriers, and
   the transition of an electron from the upper subband to the middle subband forms the basis for the optical gain.

2. The laser as claimed in claim 1, characterized in that it further comprises an InP substrate, on which said layers are placed.

3. The laser as claimed in claim 2, characterized in that the confinement layer opposite said substrate has a structure defining a diffraction grating having a pitch equal to a multiple of half the desired wavelength of its emission spectrum.

4. The laser as claimed in claim 1, characterized in that said first and second materials are chosen such that they have lattice parameters one of which is greater, the other of which is smaller than those of said substrate.

5. The laser as claimed in claim 4, characterized in that the second material is InGaAs and the first is chosen from AlGaAs, InP and AlInAs.

6. The laser as claimed in claim 1, characterized in that, in each layer (20) of the gain region, the thickness of the first type of strata (26) of the active region increases monotonically from one to the other of the adjacent barriers (22).

7. The laser as claimed in claim 6, characterized in that it further comprises an InP substrate, on which said layers are placed.

8. The laser as claimed in claim 6, characterized in that said first and second materials are chosen such that they have lattice parameters one of which is greater, the other of which is smaller than those of said substrate.

9. The laser as claimed in claim 1, characterized in that the first type of strata (26) and the second type of strata (28) have concentrations of 100% of the first and of the second materials, respectively, in their middle parts, while between two middle parts, the strata are formed from an alloy of said two materials, the concentrations of which vary continuously.

10. The laser as claimed in claim 9, characterized in that the confinement layer opposite said substrate has a structure defining a diffraction grating having a pitch equal to a multiple of half the desired wavelength of its emission spectrum.

11. The laser as claimed in claim 9, characterized in that the second material is InGaAs and the first is chosen from AlGaAs, InP and AlInAs.

12. The laser as claimed in claim 9, characterized in that said first and second materials are chosen such that they have lattice parameters one of which is greater, the other of which is smaller than those of said substrate.

13. The laser as claimed in claim 9, characterized in that the second material is InGaAs and the first is chosen from AlGaAs, InP and AlInAs.

14. A quantum cascade laser comprising:
   a gain region (14) formed from several layers (20), which each comprise:
      alternating strata of a first type (26) each defining a quantum barrier and strata of a second type (28) each defining a quantum well, said strata consisting of first and second semiconductor materials, respectively constituting said barriers and said wells, and
      several injection barriers (22), each being formed from a stratum of the first type and interposed between two of said layers (20),
   two optical confinement layers (12, 16) placed on each side of the gain region (14), and
   two electrodes (10), each adjoining one of the confinement layers (12, 16) in order to apply an electric field thereto,
characterized in that the layers of the gain region (14) each constitute an active region extending from one to the other of the injection barriers (22) which are adjacent to it and in which said strata (26, 28) are dimensioned such that:
   each of the wells comprises, in the presence of an electric field, at least a first upper subband, a second middle subband and a third lower subband,
   the probability of an electron being present in the first subband is highest in the vicinity of one of the adjacent barriers, in the second subband in the middle part of the region and in the third subband in the vicinity of the other of the adjacent barriers, and at
   the transition of one electron from the upper subband to the middle subband forms the basis for the optical gain.

15. The laser as claimed in claim 14, characterized in that it further comprises an InP substrate, on which said layers are placed.

16. The laser as claimed in claim 14, characterized in that said first and second materials are chosen such that they have lattice parameters one of which is greater, the other of which is smaller than those of said substrate.

17. The laser as claimed in claim 14, characterized in that the first type of strata (26) and the second type of strata (28) have concentrations of 100% of the first and of the second materials, respectively, in their middle parts, while between two middle parts, the strata are formed from an alloy of said two materials, the concentrations of which vary continuously.

18. The laser as claimed in claim 17, characterized in that said first and second materials are chosen such that they have lattice parameters one of which is greater, the other of which is smaller than those of said substrate.

19. The laser as claimed in claim 17, characterized in that the confinement layer opposite said substrate has a structure defining a diffraction grating having a pitch equal to a multiple of half the desired wavelength of its emission spectrum.

20. The laser as claimed in claim 17, characterized in that the second material is InGaAs and the first is chosen from AlGaAs, InP and AlInAs.

* * * * *